United States Patent [19]

Tarumi et al.

[11] 4,308,333
[45] Dec. 29, 1981

[54] CADMIUM SULFIDE-TYPE PHOTOCONDUCTOR WITH AN ISOCYANATE FILM

[75] Inventors: Noriyoshi Tarumi, Tama; Akihiko Tamura; Masakazu Kokiso, both of Hachioji, all of Japan

[73] Assignee: Konishiroku Photo Industry Co., Ltd., Tokyo, Japan

[21] Appl. No.: 21,707

[22] Filed: Mar. 19, 1979

Related U.S. Application Data

[63] Continuation of Ser. No. 775,949, Mar. 9, 1977, abandoned.

[30] Foreign Application Priority Data

Mar. 13, 1976 [JP] Japan ................................. 51-26645

[51] Int. Cl.³ .............................................. G03G 5/04
[52] U.S. Cl. ..................................... 430/89; 430/127; 430/94; 430/87

[58] Field of Search ....................... 430/94, 95, 87, 66, 430/901, 127, 89

[56] References Cited

U.S. PATENT DOCUMENTS 3,567,440  3/1971  Kosche ................................. 430/94
3,745,002  7/1973  Honjo .................................. 430/112

Primary Examiner—Richard L. Schilling
Assistant Examiner—John L. Goodrow
Attorney, Agent, or Firm—James E. Nilles

[57] ABSTRACT

A photoconductive material of a fine crystal of a cadmium sulfide-type photoconductive compound, on the surface of the crystal a film-forming compound having a dehydrating function such as an isocyanate compound is deposited. The photoconductive material is employed for forming an electrophotographic material or a photocell.

6 Claims, No Drawings

CADMIUM SULFIDE-TYPE PHOTOCONDUCTOR WITH AN ISOCYANATE FILM

This is a continuation of application Ser. No. 775,949, filed Mar. 9, 1977, now abandoned.

This invention relates to a photoconductive material which is used, for example, for a photosensitive layer of a photosensitive material in electrophotography or a photo-cell.

Fine crystal powder of cadmium sulfide-type photoconductive material as such has so far been used principally as a photoconductive material. On the surface of a particle of the fine crystal powder, however, there are distributed locally active portions which tend to absorb water easily, leading thereby to ready deterioration of characteristics of the photoconductive material. The fine crystal powder, for instance, absorbs moisture from the air during storage or from external air which is entrapped in a binder resin in an amount as much as 30% by volume when the powder is employed for the preparation of a photosensitive layer of an electrophotographic photosensitive material.

In consequence, not only the dark resistance of the resulting photosensitive layer is lowered, but also the photosensitive layer itself becomes hygroscopic and absorbs the moisture. When charged by corona discharge, therefore, such a photosensitive layer does not acquire an adequate initial potential and fails to yield a sufficient developed image density. Likewise when used in a repeated transfer system electrophotographic copying machine, on such a photosensitive layer easily causes dielectric breakdown which results in poor image-formation and various other problems.

In view of the above said problems of the conventional photoconductive material, the present invention is directed primarily to provide a novel photoconductive material not containing water that exerts adverse effects on the characteristics of the photoconductive material.

It is another object of the present invention to provide a photoconductive material which does not absorb or adsorb water and on the contrary, prevents positively absorption or adsorption of the water and consequently has a high dark resistance even in the atmosphere of a high humidity.

It is another object of the present invention which hardly absorbs water over an extended period of storage and consequently, does not at all cause, or hardly causes, any deterioration of its characteristics.

It is a further object of the present invention to provide a photoconductive material which insures the production of an excellent photosensitive layer of an electrophotographic photosensitive material yielding a high quality image-formation, or an excellent photo-cell.

It is still another object of the present invention to provide an electrophotographic photosensitive material or a photo-cell of which photoconductive characteristics are not at all deteriorated, or only extremely slightly, even if deteriorated, due to moisture present in the atmosphere during the storage or the use thereof, and consequently, which maintains its excellent photoconductive characteristics over a long period of time as well as a long service life.

In order to accomplish these and other objects, the present invention uses, as a photoconductive material, a fine powder of a cadmium sulfide-type compound onto which surface is adhered or deposited a compound having dehydrating function as well as a film-forming property such as, for example, a compound having an isocyanate group, an ethylene imin group, or an epoxy group.

More specifically, when an isocyanate compound is used as a film-forming compound having dehydrating function, the compound is dissolved in a proper solvent such as acetone, various alcohols, methyl ethyl ketone, ethyl acetate, butyl acetate and the like in a proportion of about 0.1–10% by weight. Next, fine crystal of the above-mentioned cadmium sulfide type photoconductive material is charged into the resulting solution. After the fine crystal is precipitated, the supernatant is removed and the solvent is allowed to evaporate. Thereafter, the precipitate is heat-treated at a temperature of 80°–150° C. whereby the isocyanate compound is adhered to the surface of the fine crystal of the above-mentioned photoconductive compound.

The above-mentioned process provides the photoconductive material of the present invention in the form of powder. When a proper binder resin is added to the solution in which the fine crystal of the photoconductive compound has been dipped in the above-mentioned process, the resulting solution can be used as a photosensitive liquid to form directly a photosensitive layer of an electrophotographic photosensitive material, for example, which photosensitive material comprises the photoconductive material of the present invention.

As specific examples of the afore-mentioned cadmium sulfide type photoconductive compounds, mention can be made of cadmium sulfide (CdS), zinc selenide (ZnSe), zinc sulfide (ZnS), cadmium selenide (CdSe), cadmium sulfide selenide (CdSSe) and the like.

The photoconductive material in accordance with the present invention mentioned above provides various effects some of which are as follows. Namely, since the compound to be adhered to the surface of the photoconductive compound has dehydrating function and film-forming property, the adhesion of the former to the latter removes the water absorbed in the photoconductive compound or water of crystallization thereof whereby the photoconductive compound as the principal constituent is free of the water which exerts adverse effects on the properties thereof. Further, since the active portions of the former compound attach preferentially to the fine crystal of the photoconductive compound, or combine preferentially with the same, the active portions are sealed thereby so that even when these portions are brought into contact with water, absorption of the water onto the surface of fine crystal is prevented substantially.

Moreover, since the former compound has a film-forming property, it eventually covers the surface of the fine crystal of the photoconductive compound. Because the resulting film is water-resistant, further, it prevents the direct contact of water onto the surface of the fine crystal.

For the above-mentioned reasons, the photoconductive material of the present invention neither contains any water therein which hinders the photoconductive characteristics of the same, nor absorbs the detrimental water from the outside. In consequence, an excellent characteristics of the photoconductive material such as a high dark resistance do not cause any degradation even after storage over an extended period of time or in the atmosphere of a high humidity, thereby eliminating specific consideration for its storage or use.

These advantages of the photoconductive material of the present invention lead to advantages of photoconductive products using the same. For instance, when the material of the present invention is used for the production of a photosensitive layer of an electrophotographic photosensitive material, the moisture resistance of the resulting photosensitive layer is improved to a marked extent which in turn improves the electric properties of the layer such as a high initial potential and preventing dielectric breakdown. Accordingly, the photoconductive material can be used extremely suitably as a photosensitive material for a repeated transfer system electrophotographic copying machine in which it undergoes repeated corona discharge.

Using the material of the present invention there can be obtained an excellent photo-cell which does not lower its characteristics when used even in the atmosphere of a high humidity and which has a large dark resistance for a prolonged period of time. Hence, the photo-cell thus obtained mitigates various conditions imposed on its use.

When the entire surface of the fine crystal of the photoconductive material is covered perfectly with the film of the afore-mentioned dehydrating- and film-forming compound and in addition, when the film is thick, desired photoconductivity of the photoconductive material tends to be lost. For this reason, the thickness of the film is preferably not more than about 2 microns. If there are voids on the surface which expose a part of the surface of the fine crystal, the photoconductivity is retained even if the film is thick. Even a monomolecular film can accomplish sufficiently the afore-mentioned effects insofar as the film is attached to the surface of the photoconductive material. Accordingly, for dipping the fine crystal, concentration, viscosity and the like of the solution of the dehydrating- and film-forming compound may be selected properly in consideration of types, properties and the like of the film-forming compound.

As the film-forming compound having dehydrating function, various compounds can be used in the present invention. Among them, especially preferred are isocyanate compounds and most preferred are isocyanate compounds having at least two isocyanate groups. With an increasing number of isocyanate groups, the reactivity of the compound with water as well as its bondability to the fine crystal are increased, thereby forming a film of a net work structure and enhancing the water resistance of the film. Specific examples of these isocyanate compounds are as follows.

(1) Diphenylmethane-4,4'-diisocyanate

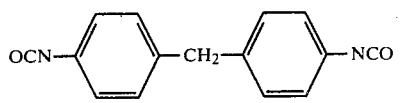

(2) Polyisocyanate, a polymer of the compound 1

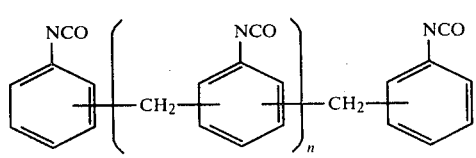

(3) Reaction product between toluidine isocyanate and trimethylol propane.

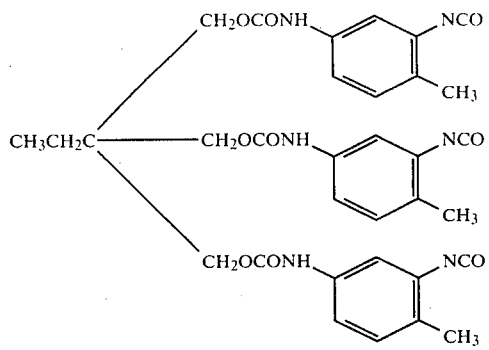

(4) Tolylene diisocyanate
A mixture of

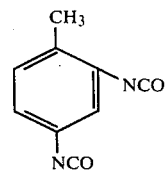

and

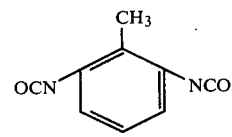

(5) 3,3'-dimethyl-diphenyl-4,4'-diisocyanate

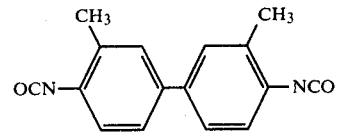

(6) 3,3'-dimethyl-diphenylmethane-4,4'-diisocyanate

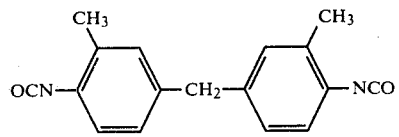

(7) m-phenylene diisocyanate

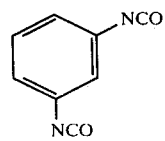

(8) Tri-phenyl-methane-triisocyanate

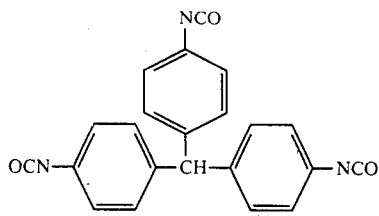

(9) 2,4-tolylene-diisocyanate

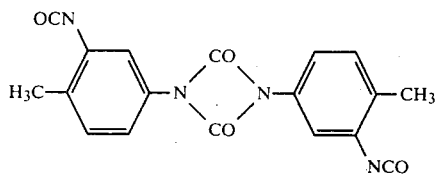

(10) Hexamethylene diisocyanate

(11) Naphthylene-1,5 diisocyanate

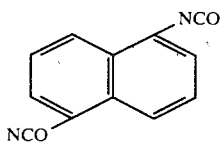

(12) 1-isocyanate-6-N,N-dicarboxyhexamethyleneisocyanate-n-hexane

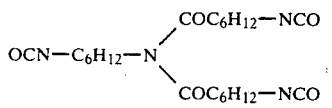

Next, preferred embodiments of the present invention are given for further illustration of the invention.

EXAMPLE 1

10 g of the fine crystal powder of cadmium sulfide having a mean particle size of 1 micron is dipped and dispersed by ultrasonic wave in 5 ml of an 1% by weight solution obtained by dissolving the isocyanate compound (3) of the above illustration in butyl acetate. After the solvent is removed by evaporation, the fine crystal powder is heat-treated at 100° C. for one hour to thereby yield a photoconductive material of the present invention.

The resulting photoconductive material is mixed with 6.0 g alkyd resin, 0.8 g butyl melamine resin (solid content: 60%), and 7 ml butyl acetate, and then dispersed by ultrasonic wave to form a photosensitive liquid. The liquid so formed is then coated onto a 100μ thick stainless steel plate and dried so that the film is 25 microns in thickness after drying. Thus, there is obtained an electrophotographic photosensitive material having the photosensitive layer which uses the alkyd resin and the melamine resin as a binder resin.

EXAMPLE 2

A photoconductive material of the present invention is prepared in the same way as in Example 1 except that the compound (8) of the illustration is used instead of the compound (3) as the isocyanate compound. An electrophotographic photosensitive material is produced from the resulting photoconductive material in the like manner.

EXAMPLE 3

An electrophotographic photosensitive material is prepared in the same way as in Example 1 except that the compound (9) of the illustration is used instead of the compound (3) as the isocyanate compound.

EXAMPLE 4

10 g of fine crystal powder of cadmium sulfide of a mean particle size of 1 micron is mixed and dispersed by ultrasonic wave in 5 ml of a 3 weight % solution of the isocyanate compound (3) of the illustration obtained by dissolving said compound in butyl acetate.

To the resulting dispersion are added sequentially
6.0 g a heat-setting acryl resin (solid content: 50%);
0.8 g a butyl melamine resin;
0.8 g an epoxy resin; and
0.08 g a fluoro-compound.

The mixture is dispersed by ultrasonic wave for 30 minutes to thereby prepare a photosensitive liquid. The liquid so formed is then coated to an aluminum plate of a thickness of 200 microns and dried so that the film is 25 microns in thickness after drying, followed by heat-treatment at 130° C. for one hour. There is thus obtained an electrophotographic photosensitive material equipped with a binder-type photosensitive layer.

For the purpose of comparison, two electrophotographic photosensitive materials are prepared in the same way as in Examples 1 and 4, respectively, except that cadmium sulfide is not treated with the solution of each isocyanate compound, for obtaining controls.

Each of the photosensitive materials obtained in Examples of the invention as well as the above-mentioned controls is subjected to a continuous copying test by loading each material to a repeated transfer type electrophotographic copying machine under the operation conditions of room temperature at 30° C. and a relative humidity of 80%.

As a result, the photosensitive material equipped with the photosensitive layer comprising the photoconductive material all provide a copied image having excellent image quality even after duplication of 5,000 copies. However, the controls cause white spots on the copied image resulting from dielectric breakdown due to corona discharge, at a copying number of about 2,000 copies. It is assumed that the dielectric breakdown results from moisture absorption of the photosensitive layer.

EXAMPLE 5

5 g of the photoconductive material of the present invention prepared in the same way as in Example 1, 2 g of an alkyd resin (a solid content of 50%) and 2 ml of xylene are mixed and dispersed to thereby form a dispersion.

The resulting dispersion is then coated on a so-called comb-type electrode having an electrode gap of 1 mm and an overall length of 150 mm that is produced by vacuum-depositing aluminum onto a polyethylene terephthalate film. The dispersion is dried and cured to thereby form a photo-cell as a sample of the present invention.

Separately, a control of the photo-cell is produced in the same way as above except that though the fine crystal powder of cadmium sulfide has the same property, it is not treated with the isocyanate compound.

The dark resistance for the sample of the present invention and the control is measured by a microammeter in terms of an electric current when a voltage of 100 V is applied across the electrodes in the atmosphere I (temperature of 30° C. and relative humidity of 30%) as well as in the atmosphere II (temperature of 30° C. and relative humidity of 80%). The results of the measurement are shown in Table below.

TABLE

| Atmosphere | Current value of sample of the invention | Current value of the control |
| --- | --- | --- |
| I | $6.5 \times 10^{-12}$A | $1.5 \times 10^{-11}$A |
| II | $2.3 \times 10^{-11}$A | $4.5 \times 10^{-9}$A |

As can be appreciated clearly from Table above, whereas the control has an extremely low dark resistance especially in the atmosphere of a high humidity, the sample of the present invention has a high dark resistance even in the atmosphere of a high humidity and excells the control also in the atmosphere of a low humidity. Incidentally, the conductivity is substantially same between the sample and the control at the time of photo-irradiation.

As hereinabove noted, in accordance with the photoconductive material of the present invention, the deterioration of the properties of the material due to water is prevented substantially perfectly. In consequence, there is no need to take specific measures of the moisture prevention for the photoconductive material of the present invention during the use or storage thereof. When used for producing a photosensitive layer of an electrophotographic photosensitive material or for a photo-cell, therefore, the photoconductive material of the present invention improves its performances to a marked extent, thereby providing extremely large advantages.

What is claimed is:

1. A photoconductive powder which consists essentially of particles of a fine crystal of a cadmium sulfide-type photoconductive material and a thin film deposited on the outer surfaces of said particles, said film being of an isocyanate compound having film-forming and dehydrating functions selected from the group consisting of diphenylmethane-4,4'-diisocyanate, polyisocyanate, reaction product between toluidine isocyanate and trimethylol propane, tolylene diisocyanate, 3,3'-dimethyl-diphenyl-4,4'-diisocyanate, 3,3'-dimethyl-diphenylmethane-4,4'-diisocyanate, m-phenylene diisocyanate, triphenyl-methanetriisocyanate, 2,4-tolylene-diisocyanate, hexamethylene diisocyanate, naphthylene-1,5-diisocyanate, and 1-isocyanate-6-N,N-dicarboxyhexamethylene-diisocyanate-n-hexane.

2. A photoconductive powder according to claim 1, wherein the thickness of said thin film is not greater than 2 microns.

3. A photoconductive powder according to claim 1, wherein said powder is prepared by dispersing particles of a fine crystal of a cadmium sulfide-type photoconductive compound in a solution containing 0.1 to 10% by weight of an isocyanate compound having film forming and dehydrating functions in a solvent, removing the solvent and heat treating the resulting product at 80° to 150° C. to adhere the isocyanate compound to the surfaces of the particles.

4. A photoconductive powder according to claim 1, wherein said isocyanate compound is selected from the group consisting of a reaction product between toluidine isocyanate with trimethylol propane, triphenyl methane triisocyanate and 2,4-tolylene diisocyanate.

5. A photoconductive powder according to claim 1, wherein said cadmium sulfide-type compound is selected from the group consisting of cadmium sulfide, cadmium selenide, cadmium sulfide selenide, zinc sulfide and zinc selenide.

6. A photosensitive material for electrophotography comprising on a conductive support a photoconductive layer comprising photoconductive powders dispersed in a binder resin, which powder consists essentially of particles of a fine crystal of a cadmium sulfide-type photoconductive material selected from the group consisting of cadmium sulfide, cadmium selenide, cadmium sulfide selenide, zinc sulfide and zinc selenide and a thin film deposited on the outer surfaces of said particles at a thickness of not greater than 2 microns, said film being of an isocyanate compound having film-forming and dehydrating functions selected from the group consisting of diphenylmethane-4,4'-diisocyanate, polyisocyanate, reaction product between toluidine isocyanate and trimethylol propane, tolylene diisocyanate, 3,3'-dimethyl-diphenyl-4,4'-diisocyanate, 3,3'-dimethyl-diphenylmethane-4,4'-diisocyanate, m-phenylene diisocyanate, tri-phenyl-methanetriisocyanate, 2,4-tolylene-diisocyanate, hexamethylene diisocyanate, naphthylene-1,5-diisocyanate, and 1-isocyanate-6-N,N-dicarboxyhexamethylene-diisocyanate-n-hexane.

* * * * *